(12) United States Patent
Yun et al.

(10) Patent No.: US 8,753,959 B2
(45) Date of Patent: Jun. 17, 2014

(54) COATING ADHESIVES ONTO DICING BEFORE GRINDING AND MICRO-FABRICATED WAFERS

(75) Inventors: Hwang Kyu Yun, Irvine, CA (US); Jeffrey Leon, Long Beach, CA (US); Raj Peddi, Irvine, CA (US); YounSang Kim, Irvine, CA (US)

(73) Assignee: Henkel IP & Holding GmbH, Duesseldorf (DE)

( * ) Notice: Subject to any disclaimer, the term of this patent is extended or adjusted under 35 U.S.C. 154(b) by 0 days.

(21) Appl. No.: 13/613,142

(22) Filed: Sep. 13, 2012

(65) Prior Publication Data

US 2013/0011999 A1    Jan. 10, 2013

Related U.S. Application Data

(63) Continuation of application No. PCT/US2011/039070, filed on Jun. 3, 2011.

(60) Provisional application No. 61/352,563, filed on Jun. 8, 2010.

(51) Int. Cl.
    *H01L 21/78*     (2006.01)
    *H01L 21/784*    (2006.01)
    *H01L 21/822*    (2006.01)
    *H01L 21/67*     (2006.01)

(52) U.S. Cl.
    CPC .............. *H01L 21/78* (2013.01); *H01L 21/784* (2013.01); *H01L 21/822* (2013.01); *H01L 21/67132* (2013.01)
    USPC ..................... 438/462; 438/460; 257/E21.599

(58) Field of Classification Search
    CPC ..... H01L 21/78; H01L 21/784; H01L 21/822; H01L 21/67132
    USPC .................................................. 438/460, 462
    See application file for complete search history.

(56) References Cited

U.S. PATENT DOCUMENTS

| 4,208,005 A | 6/1980 | Nate et al. |
| 5,356,947 A | 10/1994 | Ali et al. |
| 5,635,010 A | 6/1997 | Pepe et al. |
| 5,681,757 A * | 10/1997 | Hayes ........................... 257/778 |
| 6,534,387 B1 | 3/2003 | Shinogi et al. |
| 7,074,695 B2 | 7/2006 | Park et al. |
| 7,176,044 B2 | 2/2007 | Forray et al. |
| 7,455,095 B2 | 11/2008 | Yamamoto |
| 7,468,292 B2 | 12/2008 | Yamano |
| 7,473,617 B2 | 1/2009 | Momoi et al. |
| 7,482,251 B1 | 1/2009 | Paulsen et al. |
| 7,488,993 B2 | 2/2009 | Tokano et al. |
| 7,491,772 B2 | 2/2009 | Kamiya et al. |
| 7,494,845 B2 | 2/2009 | Hwang et al. |
| 7,494,900 B2 | 2/2009 | Harris et al. |
| 7,495,315 B2 | 2/2009 | Lee et al. |
| 7,498,520 B2 | 3/2009 | Osaka et al. |
| 7,501,300 B2 | 3/2009 | Abe |
| 7,560,519 B2 | 7/2009 | Canelas et al. |
| 2003/0022465 A1 | 1/2003 | Wachtler |
| 2004/0266940 A1 | 12/2004 | Issari |
| 2005/0003636 A1 | 1/2005 | Takyu et al. |
| 2006/0046433 A1 | 3/2006 | Sterrett et al. |
| 2007/0087532 A1 | 4/2007 | Bauer et al. |
| 2007/0155047 A1 | 7/2007 | Jayaraman et al. |
| 2007/0241436 A1 | 10/2007 | Ookubo et al. |
| 2007/0259515 A1 | 11/2007 | Paik et al. |
| 2008/0027199 A1 | 1/2008 | Mazurek et al. |
| 2008/0157303 A1 | 7/2008 | Yang |
| 2008/0176167 A1 | 7/2008 | Kawamori et al. |
| 2008/0220591 A1 * | 9/2008 | Nakamura .................... 438/464 |

FOREIGN PATENT DOCUMENTS

| JP | 03039378 A | 2/1991 |
| JP | 2001176822 A | 6/2001 |
| JP | 2005320491 A | 11/2005 |
| JP | 2007016074 A | 1/2007 |
| JP | 2007100065 A | 4/2007 |
| KR | 100379563 B1 | 4/2003 |
| WO | 8400506 A1 | 2/1984 |
| WO | 2008094149 A1 | 8/2008 |
| WO | 2011128319 A1 | 10/2011 |

OTHER PUBLICATIONS

RC-800 Series, Pulsed UV Curing Systems. Brochure, Xenon Corporation, 2006, Wilmington, MA, USA.

"If you have a problem with mercury UV curing, we have a better solution. Pulsed UV Light." Brochure, Xenon Corporation, 2006, Wilmington, MA, USA.

* cited by examiner

*Primary Examiner* — Alexander Ghyka
(74) *Attorney, Agent, or Firm* — James J. Cummings

(57) ABSTRACT

A method for preparing a semiconductor wafer into individual semiconductor dies uses both a dicing before grinding step and/or via hole micro-fabrication step, and an adhesive coating step.

5 Claims, No Drawings

COATING ADHESIVES ONTO DICING BEFORE GRINDING AND MICRO-FABRICATED WAFERS

CROSS-REFERENCE TO RELATED APPLICATIONS

This application is a continuation of the International Patent Application No. PCT/US2011/039070 filed Jun. 3, 2011, which claims the benefit of U.S. Provisional Patent Application No. 61/352,563 filed Jun. 8, 2010, the contents of both of which are incorporated herein by reference.

BACKGROUND OF THE INVENTION

This invention relates to a process for the fabrication of a semiconductor die.

Miniaturization and slimming of electrical and electronic equipment has led to a need for thinner semiconductor dies. One way to produce a thinner semiconductor die is to remove excess material from the back side of the semiconductor wafer, from which the individual dies are diced. In addition to the usual semiconductor circuitry on the wafers, some of the wafers have been micro-fabricated with via holes using through-silicon-via processes (TSV). The removal of the excess wafer typically occurs in a grinding process, commonly called back side grinding. When the wafer is diced into individual semiconductor circuits before the wafer is thinned, the process is called "dicing before grinding" or DBG.

In a DBG process, a support tape, called a dicing tape, is applied to the back side of the wafer and dicing grooves are cut, by saw or laser, between the circuits to a depth that will meet or pass the level to which the back side grinding will be done. The via holes are fabricated at this time using TSV processes. The dicing tape is removed from the back side of the wafer and another support tape is applied to the top side of the wafer to protect the circuitry during back side grinding. The material on the back side of the wafer is removed until the via holes and dicing grooves are reached, which singulates the dies.

After the backgrinding step, a film adhesive coating (usually pre-formed to the shape of the wafer) is laminated to the entire back side of the wafer. This adhesive is used later to attach the individual dies to their selected substrates. The use of the film adhesive requires an additional sawing step to cut the film. Without the additional sawing step, the dies will remain connected to each other by the adhesive film, and cannot be picked up and placed on their designated substrates.

The grinding process tends to shift the dies around, so it is difficult to use a mechanical saw as the dicing streets are no longer straight lines. Instead, a laser saw, which can be programmed to cut through the uneven dicing grooves, is used. If adhesive pastes, some of which can be UV curable, are used instead of film, the adhesive coating will cover the dicing streets, again requiring the use of a laser saw. Using the laser saw is a slow process, and the laser saw itself is an expensive and additional piece of equipment.

In another DBG process, the adhesive can be accurately applied onto the back side of diced wafers using ink jet head. However, this method is extremely slow and requires extremely low viscosity liquids.

Processes for pre-applied underfill have similar problems.

The current invention provides a solution to these problems.

SUMMARY OF THE INVENTION

This invention is a method for preparing semiconductor wafers. The semiconductor wafer has a plurality of circuits and/or solder bumps on the top side of the wafer and via holes through the wafer.

In one embodiment, the invention is a method for preparing a semiconductor wafer into individual semiconductor circuits, the wafer having a plurality of circuits on the top side of the wafer, the method comprising the steps of:
 (1) applying a tape onto the back side of the wafer;
 (2) forming dicing grooves into the top side of the wafer between adjacent circuits and via holes to a final target depth, or slightly deeper, for the wafer;
 (3) removing the tape from the back side of the wafer and applying a tape onto the top side of the wafer;
 (4) thinning the wafer by removing material from the back side of the wafer
 (5) applying an adhesive coating to the back side of the circuits;
 (6) B-stage curing the adhesive either thermally or photochemically;
 (7) removing the tape from the top side of the wafer and applying a tape onto the adhesive coating.

In a second embodiment, the invention is a method for preparing a semiconductor wafer into individual semiconductor circuits, the wafer having a plurality of circuits and solder bumps on the top side of the wafer, the method comprising the steps of:
 (1) applying a tape onto the back side of the wafer;
 (2) dicing into the top side of the wafer between the adjacent circuits and solder bumps completely through the wafer to the tape on the back side of the wafer;
 (3) applying an adhesive coating to the top side of wafer;
 (4) B-stage curing the adhesive either thermally or photochemically.

In a third embodiment, the invention is a method for preparing two or more semiconductor wafers into individual semiconductor circuits, the wafers having a plurality of circuits on the top side of the wafer and via holes through the wafer, the method comprising the steps of:
 (1) providing a first wafer;
 (2) providing a second wafer and applying an adhesive coating to the top side of the second wafer;
 (3) B-stage curing the adhesive either thermally or photochemically;
 (4) contacting the adhesive coating on the top side of the second wafer to the back side of the first wafer and applying heat and pressure to bond the two wafers together;
 (5) optionally providing an additional wafer and applying an adhesive coating to the top side of the additional wafer;
 (6) B-stage curing the adhesive on the additional wafer either thermally or photochemically;
 (7) contacting the adhesive coating on the top side of the additional wafer to the back side of the second wafer and applying heat and pressure to bond the two wafers together;
 (8) optionally repeating steps (5) to (7) for subsequent wafers;
 (9) applying a tape to the back side of the bottom most wafer;
 (10) dicing into the top side of the first wafer between adjacent circuits and via holes completely through the wafers to the tape on the back side of the bottom most wafer.

DETAILED DESCRIPTION OF THE INVENTION

The formation of the plurality of circuits on the top side of the wafer is made according to semiconductor fabrication methods well documented in industry literature. The wafer is a semiconductor material, typically silicon, gallium arsenide, germanium, or similar compound semiconductor materials. The circuits can be formed below, on, or above the top surface of the wafer, and can be protected by coatings, such as, passivation layers. These are all referred to herein as the top surface of the wafer. Via holes are passageways for circuitry from one wafer to another wafer and are formed completely through the thickness of the wafer.

One type of tape used in the inventive processes is of the type commonly called a dicing tape. It is commercially available from a number of sources and in one form consists of a pressure sensitive or UV sensitive adhesive on a carrier. The purpose of this tape is to support the wafer during the subsequent dicing operations.

The dicing grooves and/or via holes are formed into the top side of the wafer between adjacent circuits to a final target depth for the wafer after backgrinding. In some operations the dicing grooves and/or via holes are cut slightly deeper into the front side of the wafer than the target depth for the wafer. This slight over-cutting facilitates the eventual singulation of the individual dies. Dicing grooves are also known as dicing streets, dicing lines, or dicing trenches. The means for forming the dicing grooves and/or via holes include, for example, mechanical or laser dicing or drilling, and wet or dry etching.

When a backgrinding step is be used to remove excess material from the wafer (to thin the wafer), the dicing tape from the back side of the wafer is removed, and a tape, commonly known as a backgrinding tape is applied, usually by lamination, to the top side of the wafer. The order in which these two sub-steps, the removal of the dicing tape and application of the backgrinding tape, are performed does not matter. The backgrinding tape acts to protect the circuits during the subsequent processing steps and to hold the circuits in place after the wafer is diced. In a particular embodiment the backgrinding tape is a UV tape. The adhesive is initially tacky, and then upon irradiation, hardens for ease of release.

To thin the wafer, any effective process can be used. In a particular embodiment, the back side of the wafer is mechanically grinded down to a level to meet the target depth for the wafer.

Typically, after a backgrinding operation, a coating is applied to the back side of the wafer. This wafer back side coating is an adhesive and is used eventually to attach the individual dies to their substrates. The application of the wafer back side coating is performed by any effective method, such as by spin coating, screen or stencil printing, or spray or jet printing. In a preferred embodiment, the coating operation is performed by spray coating.

The spray coating process deposits a relatively small predetermined amount of adhesive per unit area. The size of the droplets is within the range of one micrometer to one millimeter, and the velocity of the droplet deposition is less than 100 meters per second.

A preferred spray coating head for this operation is a pneumatic, air pressure driven spray head, such as sprayer DJ2200, sold by Asymtek.

By controlling the droplet size and velocity of the deposition, the level of adhesive can be controlled so that a very thin coating can be applied that conforms to the topography of the surface being coated. Typically, the coating is applied to a thickness within the range of 5 to 100 micrometers.

Although some minor amount of adhesive may enter the dicing grooves and via holes, the adhesive is substantially absent from the dicing grooves and via holes.

By significantly reducing the level of coating that can enter the dicing grooves, the adhesive does not connect the dies to each other and they remain singulated.

A further advantage to applying a thin coating is that the dicing grooves can act as miniature barriers to the flow of the adhesive, causing the adhesive on each singulated die to form a meniscus. The meniscus causes a slight decrease in adhesive thickness near the die edge, which gives the advantage that no additional sawing step is required. Without the additional sawing step, there is no increased adhesion at the sawing line that typically results from the pressure of the saw blades. With no increased adhesion it is easier to pick up the dies and move them to the next operation step.

By significantly reducing the level of coating that can enter the via holes, the holes remain open and subsequent removal is not needed.

The chemical composition of the coating is any adhesive that will meet the subsequent processing requirements. Such adhesives are known in the art. In one embodiment the coating is a B-stageable liquid (that can be applied in any suitable coating method, such as, spin or spray coating, or stencil, screen, or jet printing.

The coating composition can be any adhesive/encapsulant coating suitable or currently utilized for that purpose. Suitable coating compositions are typically prepared from epoxy resins, and in some cases are solid epoxy resins, such as those selected from the group consisting of cresol novolac epoxy, phenol novolac epoxy, bisphenol-A epoxy, and glycidylated resins containing backbones consisting of phenolic and fused rings systems (such as dicyclopentienyl groups). In one coating composition embodiment the epoxy resin is present in an amount of 15 to 40 wt % of the coating. In another coating composition embodiment the epoxy resin is a solid with a melting point between 80° and 130° C.

Other suitable resins, which can be used in combination with the epoxies, are acrylate resins. Suitable acrylate resins include those selected from the group consisting of butyl (meth)acrylate, isobutyl (meth)acrylate, 2-ethyl hexyl (meth)acrylate, isodecyl (meth)acrylate, n-lauryl (meth)acrylate, alkyl (meth)acrylate, tridecyl (meth)acrylate, n-stearyl (meth)acrylate, cyclohexyl(meth)acrylate, tetrahydrofurfuryl(meth)acrylate, 2-phenoxy ethyl(meth)acrylate, isobornyl (meth)acrylate, 1,4-butanediol di(meth)acrylate, 1.6 hexanediol di(meth)acrylate, 1,9-nonandiol di(meth)acrylate, perfluorooctylethyl (meth)acrylate, 1,10 decandiol di(meth)acrylate, nonylphenol polypropoxylate (meth)acrylate.

Other acrylate resins include polypentoxylate tetrahydrofurfuryl acrylate, available from Kyoeisha Chemical Co., LTD; polybutadiene urethane dimethacrylate (CN302, NTX6513) and polybutadiene dimethacrylate (CN301, NTX6039, PRO6270) available from Sartomer Company, Inc; polycarbonate urethane diacrylate (ArtResin UN9200A) available from Negami Chemical Industries Co., LTD; acrylated aliphatic urethane oligomers (Ebecryl 230, 264, 265, 270, 284, 4830, 4833, 4834, 4835, 4866, 4881, 4883, 8402, 8800-20R, 8803, 8804) available from Radcure Specialities, Inc; polyester acrylate oligomers (Ebecryl 657, 770, 810, 830, 1657, 1810, 1830) available from Radcure Specialities, Inc.; and epoxy acrylate resins (CN104, 111, 112, 115, 116, 117, 118, 119, 120, 124, 136) available from Sartomer Company, Inc.

Further acrylate resins include monocyclic acetal acrylate, (meth)acrylates containing cyclic acetals (such as, SR531 available from Sartomer); THF acrylate (such as, SR285 available from Sartomer); substituted cyclohexy (meth)acrylates (such as, CD420 available from Sartomer); acetoacetoxyethyl methacrylate, 2-acetoacetoxyethyl acrylate, 2-acetoacetoxypropyl methacrylate, 2-acetoacetoxypropyl acrylate, 2-acetoacetamidoethyl methacrylate, and 2-acetoacetamidoethyl acrylate; 2-cyanoacetoxyethyl methacrylate, 2-cyanoacetoxyethyl acrylate, N(2-cycanoacetoxyethyl) acrylamide; 2-propionylacetoxyethyl acrylate, N(2-propionylacetoxyethyl) methacrylamide, N-4-(acetoacetoxybenzyl phenyl acrylamide, ethylacryloyl acetate, acryloylmethyl acetate, N-ethacryloyloxymethyl acetoacetamide, ethylmethacryloyl acetoacetate, N-allylcyanoacetamide, methylacryloyl acetoacetate, N(2-methacryloyloxymethyl) cyanoacetamide, ethyl-a-acetoacetoxy methacrylate, N-butyl-N-acryloyloxyethyl acetoacetamide, monoacrylated polyols, monomethacryloyloxyethyl phthalate, and mixtures thereof.

In one coating composition embodiment, the acrylate is chosen to have a viscosity less than 50 mPas and a boiling point greater than 150° C. In a particular coating composition embodiment, the acrylate contains a five- or six-membered ring containing at least one oxygen in the ring. In one coating composition embodiment the acrylate resin comprises 15 to 50 wt % of the coating composition.

Suitable curing agents for the epoxy resin are present in an amount between greater than 0 to 50 wt % and include, but are not limited to, phenolics, aromatic diamines, dicyandiamides, peroxides, amines, imidizoles, tertiary amines, and polyamides. Suitable phenolics are commercially available from Schenectady International, Inc. Suitable aromatic diamines are primary diamines and include diaminodiphenyl sulfone and diaminodiphenyl methane, commercially available from Sigma-Aldrich Co. Suitable dicyandiamides are available from SKW Chemicals, Inc. Suitable polyamides are commercially available from Air Products and Chemicals, Inc. Suitable imidazoles are commercially available from Air Products and Chemicals, Inc. Suitable tertiary amines are available from Sigma-Aldrich Co.

Suitable curing agents for acrylate resins are present in an amount between 0.1 to 10% and include, but are not limited to, any of the known acetophenone-based, thioxanthone-based, benzoin-based and peroxide-based photoinitiators. Examples include diethoxyacetophenone, 4-phenoxydichloroacetophenone, benzoin, benzoin ethyl ether, benzoin isopropyl ether, benzyl dimethyl ketal, benzophenone, 4-phenyl benzophenone, acrylated benzophenone, thioxanthone, 2-ethylanthraquinone, etc. The Irgacur and Darocur lines of photoinitiators sold by BASF are examples of useful photoinitiators.

It is also possible that the coating composition will comprise a resin that is thermally curable, and a resin that is curable by free radical polymerization initiated by UV light. In a particular embodiment such a dual cure coating composition will comprise an epoxy resin, which is thermally curable, and an acrylate resin, which is curable upon UV irradiation. One coating composition embodiment comprises glycidylated o-cresol formaldehyde novolac as the epoxy resin and trimethylcyclohexyl acrylate as the acrylate resin.

It is also possible that the coating composition will contain a reactive sulfur compound, such as, a thiol or a dithioester. In one coating composition embodiment, the reactive sulfur compounds are selected from the group consisting of dodecyl mercaptan, tertiary dodecyl mercaptan, mercaptoethanol, octyl mercaptan, hexyl mercaptan, isopropyl xanthic disulfide, and mercaptan-pendant siloxane polymer. Reactive sulfur compounds will be present in amounts from 0.1% to 7% by weight of the coating composition.

An example of a mercaptan-pendant siloxane polymer has the following structure

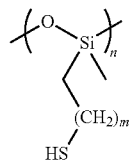

in which n is an integer between 5 and 500 denoting a polymeric number of repeating units, and m is an integer from 1 to 5. The polymeric mercaptan-pendant siloxane will be present in an amount from 0.1 to 7% by weight of the coating composition.

In one coating composition embodiment, the composition comprises (i) a solid epoxy resin with a melting point between 80° and 130° C.; (ii) an acrylate resin having a viscosity less than 50 mPas and a boiling point greater than 150° C.; and (iii) a polymeric mercaptan-pendant silicone having the structure

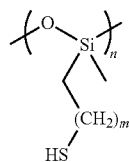

in which n is an integer between 5 and 500, and m is an integer of 1 to 5.

In some coating compositions, either conductive or non-conductive fillers can be present. Examples of suitable non-conductive fillers include alumina, aluminum hydroxide, silica, vermiculite, mica, wollastonite, calcium carbonate, titania, sand, glass, barium sulfate, zirconium, silicon carbide, boron nitride, diamond, alumina, and organic polymers including but not limited to halogenated ethylene polymers, such as, tetrafluoroethylene, trifluoroethylene, vinylidene fluoride, vinyl fluoride, vinylidene chloride, and vinyl chloride. Examples of suitable conductive fillers include carbon black, graphite, gold, silver, copper, platinum, palladium, nickel, aluminum. The particular type of filler is not critical and can be selected by one skilled in the art to suit the needs of the specific end use, such as stress reduction and bondline control.

Spacers may also be included in the formulation to control the bondline thickness of the bonded part, in types and amounts selected by the practitioner to meet the needs of the particular application, and as suitable for the chosen resin system and end use; typically amounts range between 10 and 30 wt % by weight of the coating composition. In one embodiment, the fillers are spherical in shape with an average particle diameter of greater than 2 μm and a single peak particle size distribution. Smaller particle sizes and bimodal distributions result in an unacceptably high thixotropic index, which in turn leads to poor spin coating performance and non-uniform coating thickness.

Other additives, including but not limited to adhesion promoters, antifoaming agents, antibleed agents, rheology control agents, and fluxing agents, in types and amounts known to those skilled in the art, may be included in the coating formulation. In a preferred embodiment, solvents are not part of the composition.

The coating is B-staged either thermally or photochemically to be relatively tack-free at room temperature. B-staged (and its variations, such as, B-stageable) means that the adhesive was heated to remove solvent and/or to partially cure it so that it becomes hardened and non-tacky. (Later, when the individual dies are attached to their substrates, the coating can be heated to soften and flow during die attach, or during solder reflow, and then be heated at an elevated temperature for final cure.)

The invention claimed is:

1. A method for preparing a semiconductor wafer into individual semiconductor circuits, the wafer having a plurality of circuits on the top side of the wafer, the method comprising the steps of:
    (1) applying a tape onto the back side of the wafer;
    (2) forming dicing grooves or via holes into the top side of the wafer between adjacent circuits to a final target depth, or slightly deeper, for the wafer;
    (3) removing the tape from the back side of the wafer and applying a tape onto the top side of the wafer;
    (4) thinning the wafer by removing material from the back side of the wafer
    (5) applying an adhesive coating to the back side of the circuits;
    (6) B-stage curing the adhesive either thermally or photochemically;
    (7) removing the tape from the top side of the wafer and applying a tape onto the adhesive coating.

2. The method according to claim 1 in which the adhesive coating is applied by spin coating, spray coating, ink jetting, or needle dispensing.

3. The method according to claim 1 in which the adhesive coating is substantially absent from the dicing streets and via holes.

4. The method according to claim 1 in which the adhesive coating is applied with a thickness within the range of 5 to 100 micrometers.

5. The method according to claim 1 in which the adhesive applied forms a meniscus that has a decrease in adhesive thickness near the die edge.

\* \* \* \* \*